(12) United States Patent
Kato et al.

(10) Patent No.: US 7,045,009 B2
(45) Date of Patent: May 16, 2006

(54) METHOD AND APPARATUS FOR MANUFACTURING SINGLE CRYSTAL

(75) Inventors: Tomohisa Kato, Tsukuba (JP); Shinichi Nishizawa, Tsukuba (JP); Fusao Hirose, Obu (JP)

(73) Assignees: Denso Corporation, Kariya (JP); National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 10/909,390

(22) Filed: Aug. 3, 2004

(65) Prior Publication Data

US 2005/0028725 A1 Feb. 10, 2005

(30) Foreign Application Priority Data

Aug. 4, 2003 (JP) ............................. 2003-285972

(51) Int. Cl.
*C30B 25/12* (2006.01)
*C30B 25/14* (2006.01)

(52) U.S. Cl. ...................... 117/105; 117/84; 117/109; 117/952

(58) Field of Classification Search ............... 117/84, 117/105, 109, 952
See application file for complete search history.

(56) References Cited

U.S. PATENT DOCUMENTS 6,113,692 A 9/2000 Jaussaud et al.
6,451,112 B1 9/2002 Hara et al.

FOREIGN PATENT DOCUMENTS

JP A-01-305898 11/1989
JP A-2002-060297 2/2002

*Primary Examiner*—Felisa Hiteshew
(74) *Attorney, Agent, or Firm*—Posz Law Group, PLC

(57) ABSTRACT

A method for manufacturing a single crystal includes the steps of: flowing a raw material gas toward a seed crystal in a reactive chamber so that the single crystal grows from the seed crystal; controlling the raw material gas by a gas flow control member having a cylindrical shape; passing the raw material gas through a clearance between the seed crystal and an inner wall of the gas flow control member; and flowing a part of the raw material gas to bypass the seed crystal. The method provides the single crystal having good quality.

17 Claims, 15 Drawing Sheets

METHOD AND APPARATUS FOR MANUFACTURING SINGLE CRYSTAL

CROSS REFERENCE TO RELATED APPLICATION

This application is based on Japanese Patent Application No. 2003-285972 filed on Aug. 4, 2003, the disclosure of which is incorporated herein by reference.

FIELD OF THE INVENTION

The present invention relates to a method and apparatus for manufacturing a single crystal.

BACKGROUND OF THE INVENTION

Silicon carbide (i.e., SiC) single crystal has excellent thermal and chemical properties. Further, a forbidden band width in the SiC is larger than that of silicon single crystal, so that the SiC single crystal also has excellent electronic property. Therefore, the SiC single crystal is available for high power device, high temperature device, and high frequency device. The SiC single crystal having hexagonal crystal structure for manufacturing a SiC semiconductor wafer is formed by a sublimation recrystallization method (i.e., modified Lely method). The modified Lely method is such that raw material is heated and sublimed so that the SiC single crystal grows from a seed crystal. It is required to form a large diameter and long SiC single crystal. Further, it is required to form the SiC single crystal having no crystal defect and distortion.

SUMMARY OF THE INVENTION

In view of the above-described problem, it is an object of the present invention to provide a method for manufacturing a silicon carbide single crystal having good quality.

A method for manufacturing a single crystal includes the steps of: flowing a raw material gas toward a seed crystal in a reactive chamber so that the single crystal grows from the seed crystal; controlling the raw material gas by a gas flow control member having a cylindrical shape; passing the raw material gas through a clearance between the seed crystal and an inner wall of the gas flow control member; and flowing a part of the raw material gas to bypass the seed crystal.

The method provides the single crystal having good quality and having long length and large diameter. Specifically, the raw material gas is concentrated with the gas flow control member so that the raw material gas flows toward the seed crystal. The concentration of the raw material gas at the growth surface of the seed crystal becomes higher so that the single crystal grows smoothly. Further, no poly crystal is prevented from adhering to a bottom end of the gas flow control member and an inner wall of the gas flow control member, so that the single crystal grows from the seed crystal without contacting the poly crystal.

Further, a method for manufacturing a single crystal includes the steps of: flowing a raw material gas toward a seed crystal in a reactive chamber so that the single crystal grows from the seed crystal; controlling the raw material gas by a gas flow control member having a cylindrical shape; passing the raw material gas through a clearance between the seed crystal and an inner wall of the gas flow control member; and growing the single crystal to have a predetermined shape, which includes an initial crystal growth part having an uniform diameter in a growth direction. The initial crystal growth part of the single crystal grows from the seed crystal at a beginning step of a crystal growth.

The method provides the single crystal having good quality. In this case, the concentration of the raw material gas at the growth surface of the seed crystal becomes higher so that the single crystal grows smoothly. Further, strain generated from an interface between the seed crystal and a base for mounting the seed crystal is reduced, so that the initial single crystal having good quality is obtained.

Further, an apparatus for manufacturing a single crystal includes: a seed crystal; a reactive chamber for flowing a raw material gas so that the single crystal grows from the seed crystal disposed in the reactive chamber; a gas flow control member for controlling the raw material gas to flow toward the seed crystal; and a gas passage disposed between the reactive chamber and the gas flow control member. The gas flow control member surrounds the seed crystal through a clearance. The clearance is capable of passing the raw material gas therethrough. The gas passage is capable of flowing a part of the raw material gas to bypass the seed crystal. The apparatus provides the single crystal having good quality and having long length and large diameter.

Further, an apparatus for manufacturing a single crystal includes a seed crystal; a reactive chamber for flowing a raw material gas so that the single crystal grows from the seed crystal disposed in the reactive chamber; a gas flow control member for controlling the raw material gas to flow toward the seed crystal; and a through hole disposed in the gas flow control member. The gas flow control member surrounds the seed crystal through a clearance. The clearance is capable of passing the raw material gas therethrough. The through hole is capable of flowing a part of the raw material gas to bypass the seed crystal. The through hole is disposed at an outside of the gas flow control member. The apparatus provides the single crystal having good quality and having long length and large diameter.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

Figure 13:
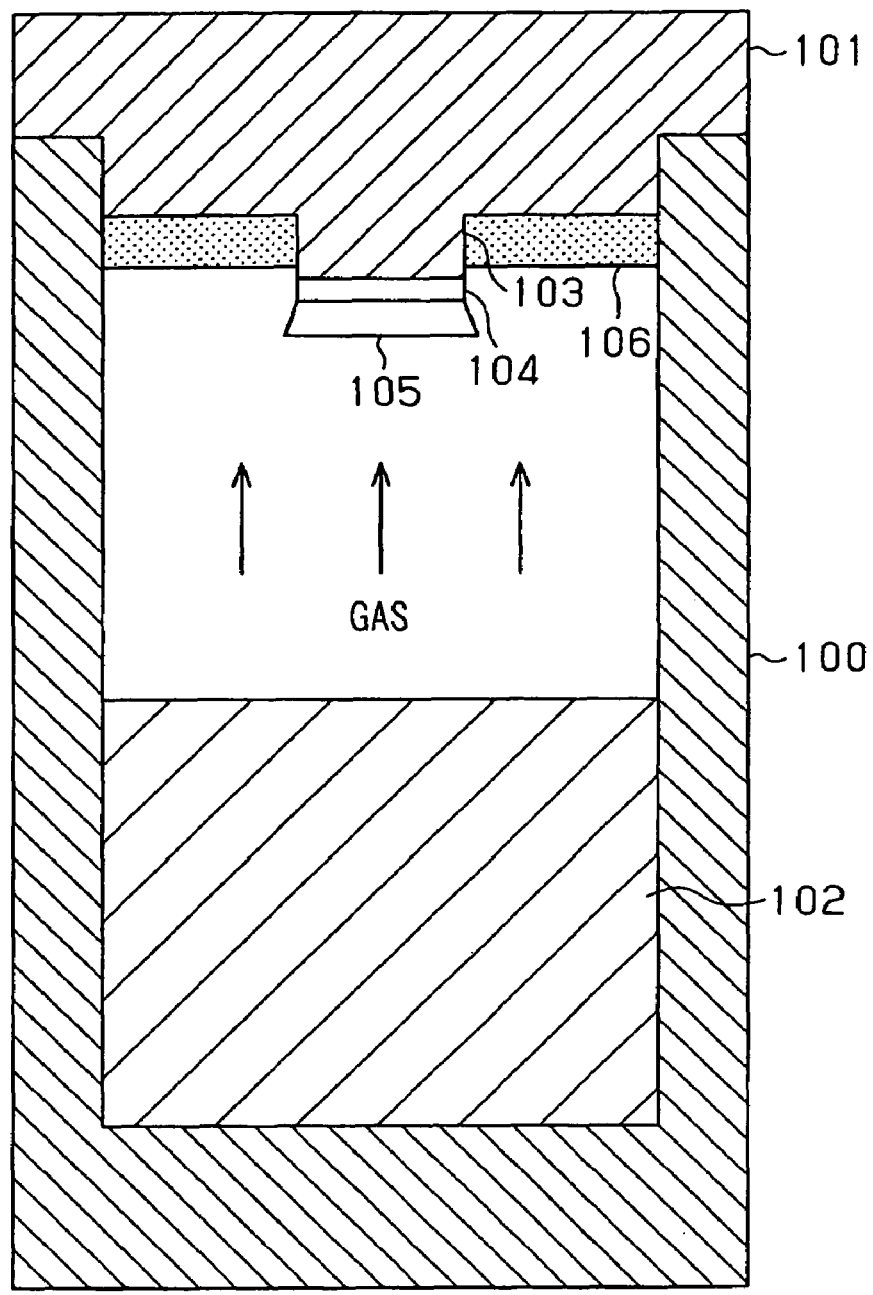
FIG. 13 is a cross sectional view showing an apparatus as a comparison, according to the first embodiment.

The inventors have preliminary studied about a sublimation recrystallization method for manufacturing a silicon carbide (i.e., SiC) single crystal. As shown in FIG. 13, a crucible 100 has an upper opening, which is covered with a cover 101. A SiC raw material 102 is introduced in the crucible 100. The cover 101 has a base 103 protruded from the cover 101. A seed crystal 104 is mounted on the base 103. The base 103 is disposed at almost center of the cover 101. A SiC single crystal 105 grows from the seed crystal 104. Further, a SiC poly crystal 106 is deposited around the base 103. The timing for contacting the SiC poly crystal 106 to the SiC single crystal 105 is delayed so that the SiC single crystal 105 grows larger. Specifically, the diameter of the SiC single crystal 105 becomes larger.

Figure 14:
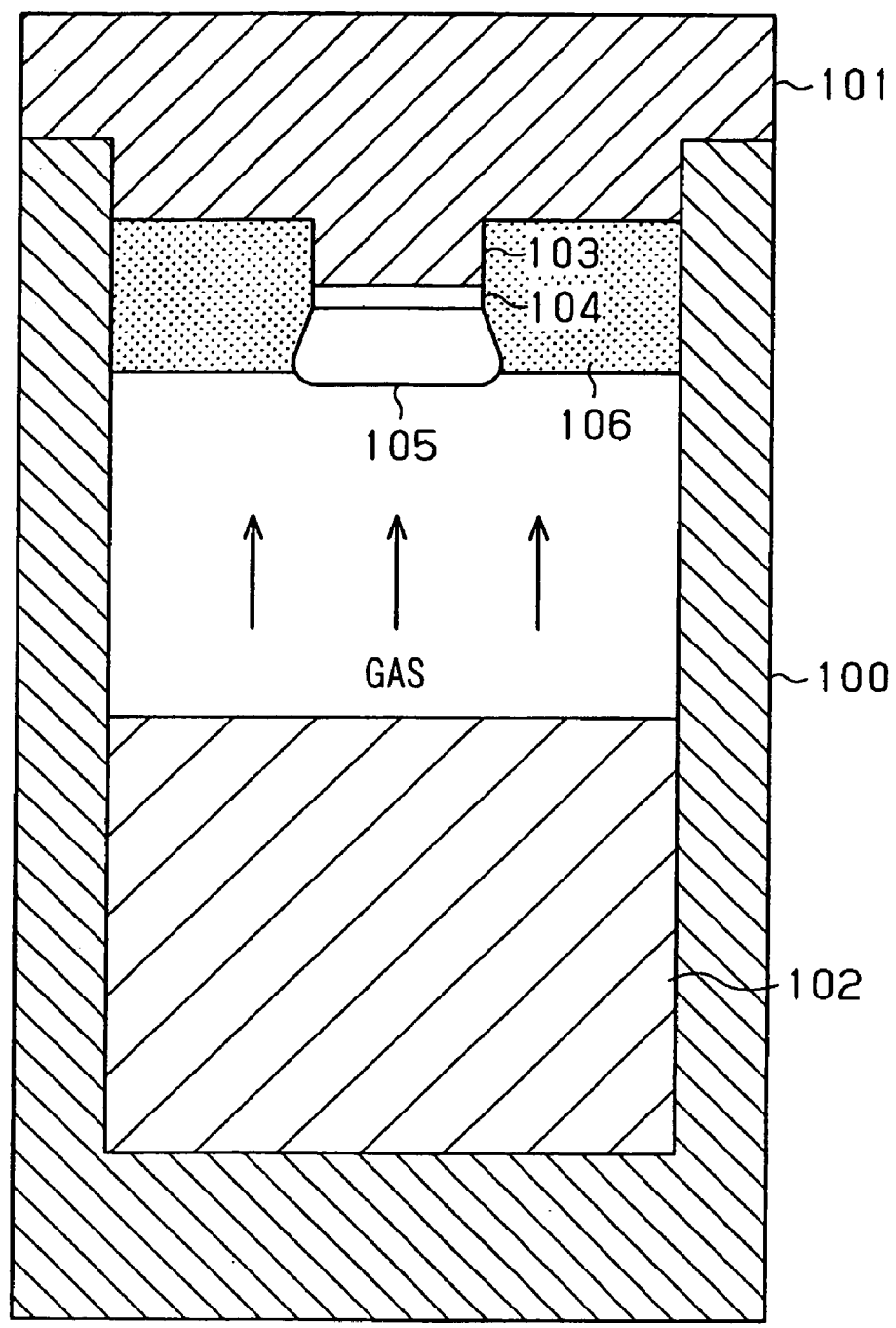
FIG. 14 is a cross sectional view explaining crystal growth performed by the apparatus as the comparison, according to the first embodiment.

However, when the crystal growth proceeds at a certain amount, the SiC poly crystal 106 contacts the SiC single crystal 105, as shown in FIG. 14. Thus, the SiC single crystal 105 is prevented from growing so that the diameter and the length of the SiC single crystal 105 do not become larger much more. Further, when the SiC poly crystal 106 contacts the SiC single crystal 105, a strain is introduced into the SiC single crystal 105 from an interface between the SiC single crystal 105 and the SiC poly crystal 106. Further, a macro defect may be generated in the SiC single crystal 105. Therefore, the crystalline quality of the SiC single crystal 105 is reduced.

Figure 15:
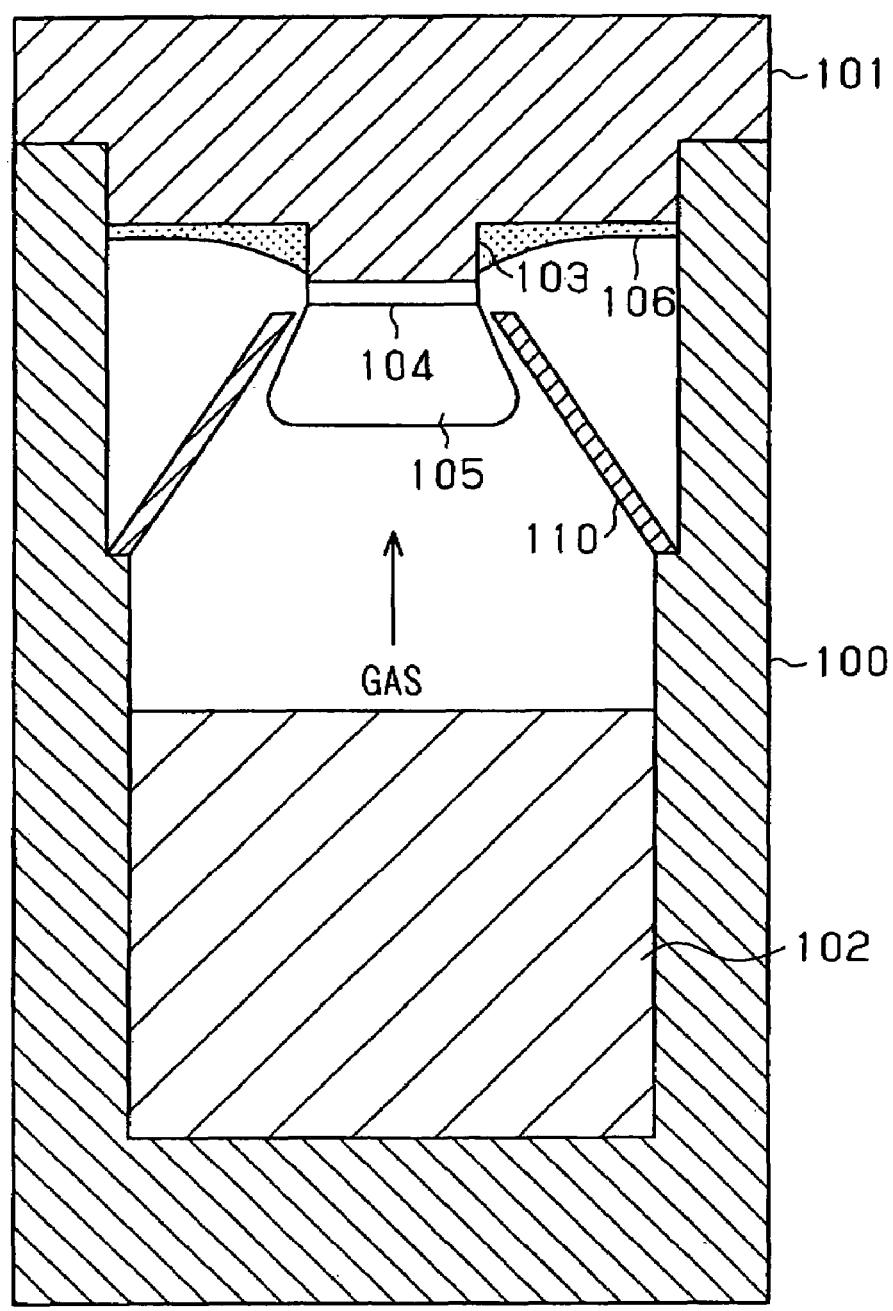
FIG. 15 is a cross sectional view showing another apparatus as another comparison, according to the first embodiment.
Figure 16:
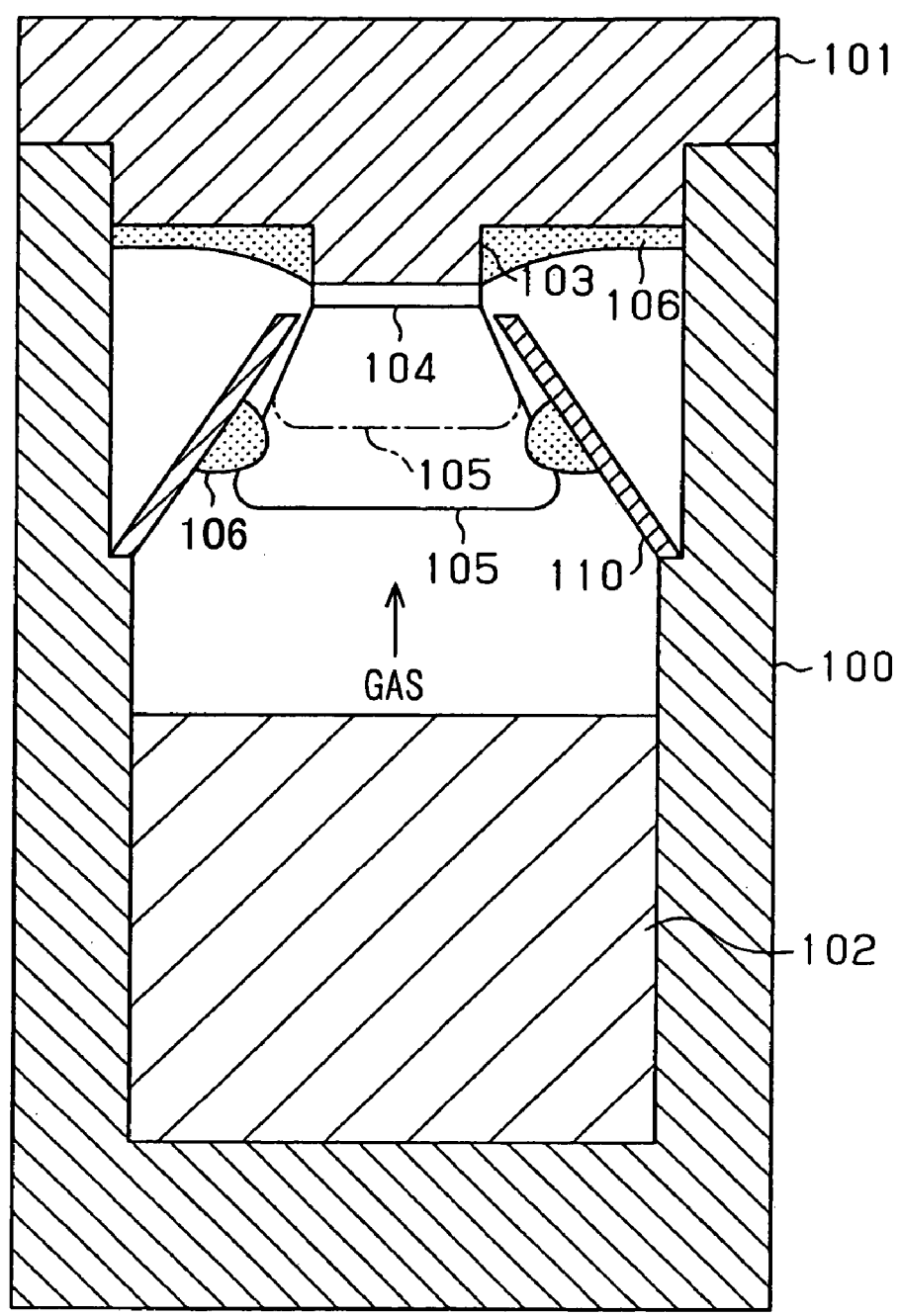
FIG. 16 is a cross sectional view explaining crystal growth performed by the other apparatus as the other comparison, according to the first embodiment.

To protect the SiC single crystal 105 from the SiC poly crystal 106, a guide 110 is formed in the crucible 100, as shown in FIG. 15. The guide 110 separates the SiC poly crystal 106 from the SiC single crystal 105 so that the sublimation gas of the SiC raw material 102 is introduced to the seed crystal 104 effectively. The SiC single crystal 105 grows efficiently, and the SiC poly crystal 106 is deposited around the seed crystal 104 slowly. Thus, the SiC single crystal 105 grows largely. However, the SiC poly crystal 106 is deposited on the inner wall of the guide 110. In this case, the SiC poly crystal 106 may contact the SiC single crystal 105, so that the diameter and the length of the SiC single crystal 105 do not become larger much more. Further, the strain is introduced into the SiC single crystal 105, and the macro defect is generated in the SiC single crystal 105. Thus, the crystalline quality of the SiC single crystal 105 is reduced.

In view of the above study, a new method according to a first embodiment of the present invention is provided as follows.

Figure 1:
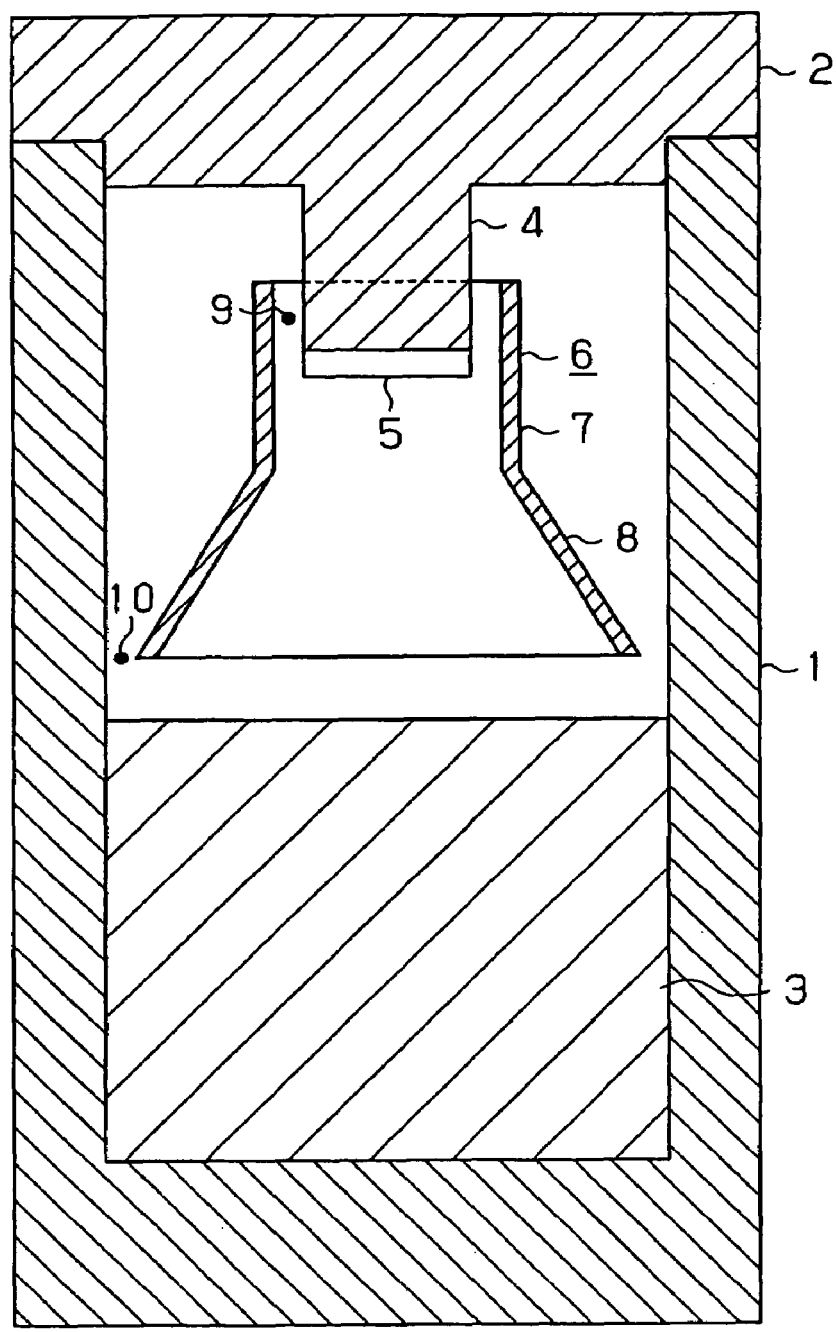
FIG. 1 is a cross sectional view showing an apparatus for manufacturing SiC single crystal according to a first embodiment of the present invention.
Figure 2:
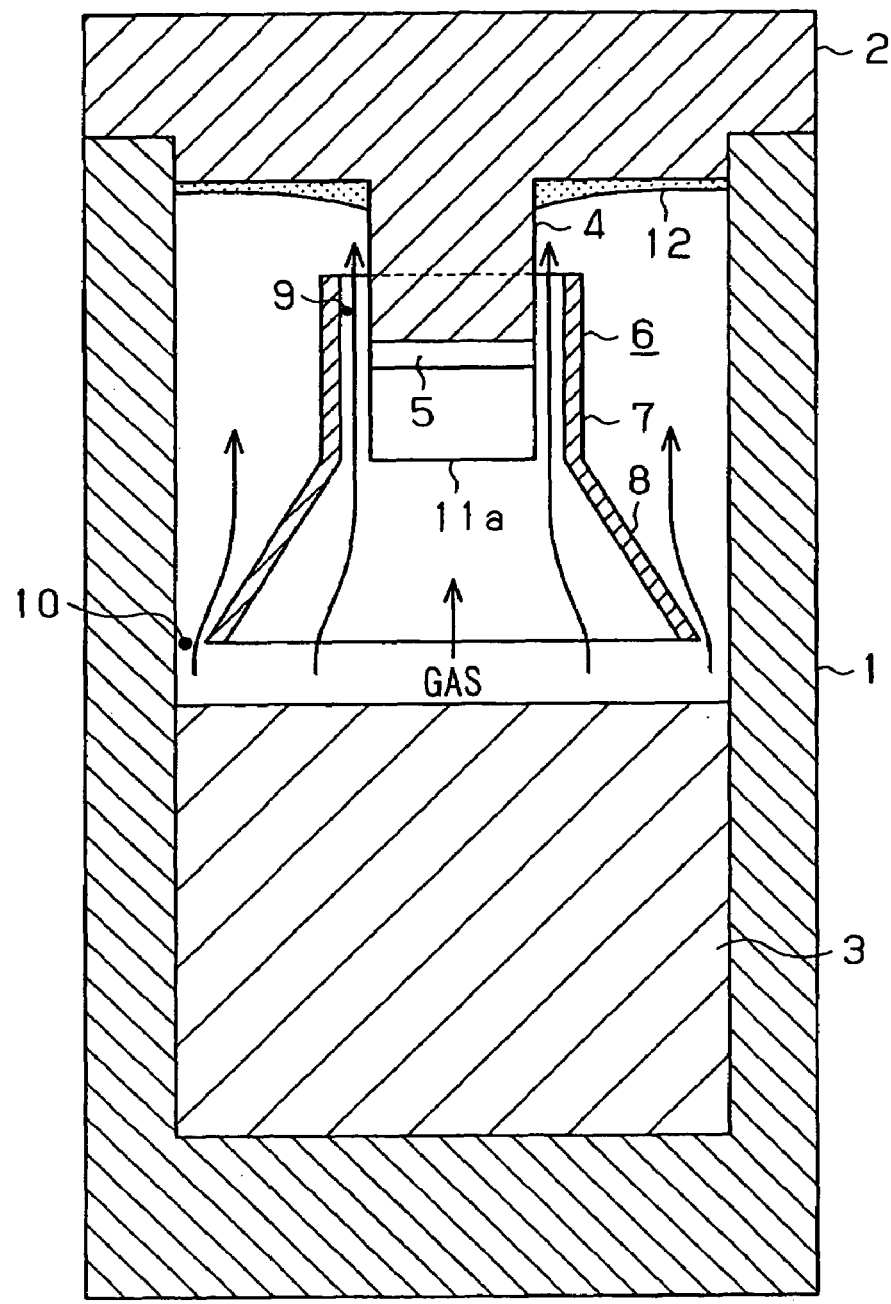
FIG. 2 is a cross sectional view explaining crystal growth performed by the apparatus according to the first embodiment.
Figure 3:
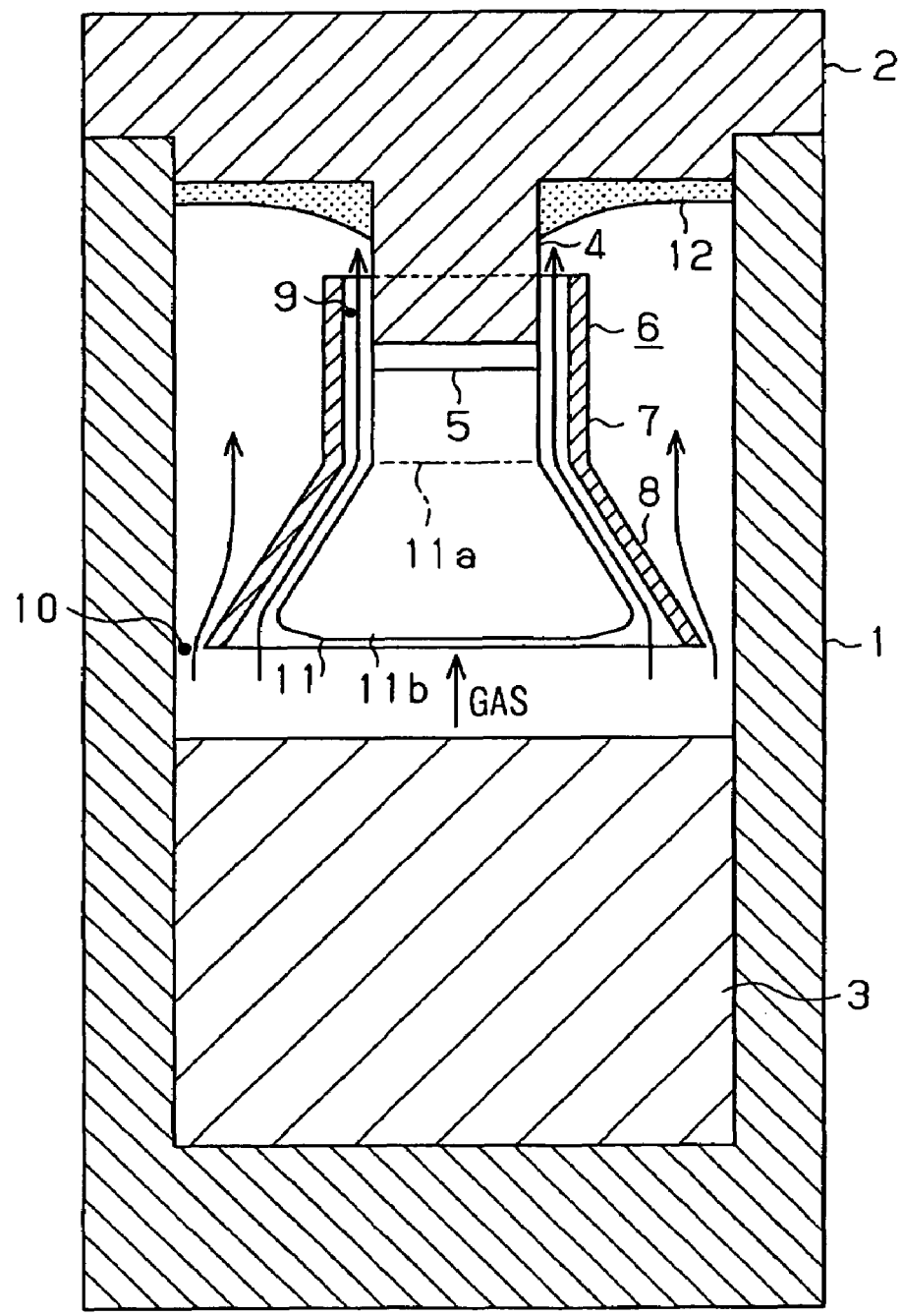
FIG. 3 is a cross sectional view explaining the crystal growth performed by the apparatus according to the first embodiment.

FIGS. 1 to 3 show an apparatus for manufacturing a SiC single crystal 11. The SiC single crystal 11 grows from a SiC seed crystal 5 by a sublimation re-crystallization method (i.e., modified Lely method). In FIG. 1, a growth chamber for manufacturing the SiC single crystal 11 includes a graphite crucible 1 and a graphite cover 2. The graphite crucible 1 has a cylindrical shape having a bottom. The graphite crucible 1 has an upper opening, which is covered with the graphite cover 2. Thus, the cover 2 closes the upper opening of the crucible 1, so that the inside of the crucible 1 becomes almost sealed space. Here, the crucible 1 can be coated with a high heat resistance material such as tantalum carbide (i.e., TaC), tungsten carbide (i.e., WC) and silicon carbide (i.e., Sic).

A SiC raw material 3 is introduced into the crucible 1. The SiC raw material 3 is a powder of the Sic. A base 4 for supporting a SiC seed crystal 5 is protruded from the cover 2. Specifically, the base 4 is disposed at the center of the cover, and disposed on the bottom of the cover 2. The cover 2 and the base 4 are integrally formed each other. The base 4 has a cylindrical shape. However, the base 4 can have another shape. Preferably, the base 4 has a cylindrical shape. The base 4 protrudes from the bottom of the cover 2 sufficiently. The SiC seed crystal 5 is mounted on the bottom of the base 4. The seed crystal is a SiC single crystal substrate. Thus, one surface of the seed crystal 5 is bonded to the bottom of the base 4. The other surface of the seed crystal 5 faces the SiC raw material 3. The seed crystal 5 has the same diameter as the base 4. The seed crystal 5 is disposed horizontally, and the SiC single crystal 11 grows in a growing direction parallel to a normal line of the bottom of the seed crystal 5, which is parallel to a vertical direction of the apparatus.

The raw material 3 is the SiC powder formed by Acheson method or chemical synthesis method. The seed crystal 5 is the SiC single crystal formed by the Acheson method or the Lely method, or formed by the modified Lely method from the SiC single crystal obtained by the Acheson method or the Lely method. The SiC single crystal obtained by the Acheson method or the Lely method is Acheson crystal or Lely crystal. The seed crystal has a thickness in a range between 0.1 mm and 10 mm.

A heater (not shown) is disposed around the crucible 1. The heater is, for example, an induction coil or the like. The heater heats the inside of the crucible 1, i.e., the raw material 3. A gas flow control member 6 is formed in the growth chamber, i.e., the crucible 1 with the cover 2. The gas flow control member 6 surrounds the seed crystal 5 and the SiC single crystal 11 to be formed on the seed crystal 5 through a clearance 9. The gas flow control member 6 controls the gas flow flowing in the growth chamber so that the gas flows toward the seed crystal 5. The gas flow control member 6 is formed from a plate, and composed of an upper cylinder 7 and a lower cylinder (i.e., a lower cone) 8. Thus, preferably, the gas flow control member 6 has a cylindrical shape. However, the gas flow control member 6 can have another shape. The upper cylinder 7 has a uniform inner diameter, and the lower cylinder 8 has a tapered shape. The top end opening of the upper cylinder 7 is disposed around the base 4, which is disposed on the upper side from the seed crystal 5. The bottom end opening of the upper cylinder 7 is disposed on the lower side from the seed crystal 5. Therefore, the seed crystal 5 is disposed in the upper cylinder 7. Thus, the upper cylinder 7 is disposed in a certain height range, which includes the height of the seed crystal 5 and a predetermined height apart from the bottom (i.e., the growth surface) of the seed crystal 5. The upper cylinder 7 is disposed separately from the base 4 so that the clearance 9 between the base 4 and the upper cylinder 7 is formed. Thus, the upper cylinder 7 is separated from the base 4 spatially. The raw material gas flows through the clearance 9, as shown in FIG. 3. The lower cylinder 8 smoothly connects to the bottom end opening of the upper cylinder 7. The uniform inner diameter of the upper cylinder 7 is equal to an inner diameter of the upper end of the lower cylinder 8. The inner diameter of the lower cylinder 8 becomes larger linearly in the growth direction (i.e., toward the growth direction).

A gas passage 10 is disposed between the gas flow control member 6 and the inner wall of the crucible 1 so that a part of the raw material gas flows through the gas passage 10 to bypass the gas flow control member 6, i.e., the seed crystal 5. Thus, the part of the raw material gas flows through the gas passage 10 along with the inner wall of the crucible 1, which faces the SiC single crystal 11. The upper cylinder 7 of the gas flow control member 6 corresponds to the early stage (i.e., the beginning) of the crystal growth from the seed crystal 5, and the inner diameter of the upper cylinder 7 does not increase. The lower cylinder 8 of the gas flow control member 6 corresponds to the second stage of the crystal growth. The inner diameter of the lower cylinder 8 increases. Thus, the SiC single crystal 11 grows without increasing the diameter of the single crystal 11 at the early stage of the crystal growth. The SiC single crystal 11 grows with increasing the diameter of the single crystal 11 at the second stage of the crystal growth.

Next, the SiC single crystal 11 grows from the seed crystal 5 as follows. Firstly, the cover 2 is removed from the crucible 1. The seed crystal 5 is bonded to the base 4 with adhesive. The SiC raw material 3 is inserted into the crucible 1. After that, the cover 2 is attached on the crucible 1.

The crucible 1 is heated in a furnace filled with high purity argon gas atmosphere. The furnace is, for example, a high frequency heating furnace, a resistance heating furnace, an infra-red heating furnace or the like. While the crucible 1 is heated, the temperature of the top of the cover 2 and the temperature of the bottom of the crucible 1 are measured by, for example, pyrometer so that the heater is controlled. The temperature of the top of the cover 2 corresponds to the temperature of the seed crystal 5, and is defined as Ta. The temperature of the bottom of the crucible 1 corresponds to the temperature of the raw material 3, and is defined as Tb. The temperature of the seed crystal (i.e., the seed crystal temperature) Ta is set to be in a range between 2000° C. and 2500° C. A special temperature gradient between the seed crystal 5 and the raw material 3, which is defined as (Ta—Tb)/H, is set to be in a range between 0° C./cm and 20° C./cm. Here, H represents a distance between the seed crystal 5 and the raw material 3. The crystal growth is performed after the temperature of the crucible 1 becomes a predetermined temperature. Then, the inner pressure of the growth chamber (i.e., the crucible 1 with the cover 2) is decompressed so that the crystal growth begins. The inner pressure is held at a predetermined constant pressure, which is in a range between 1 Torr and 100 Torr. When the SiC single crystal 11 grows from the seed crystal 5, the raw material gas, i.e., the sublimation gas of the raw material 3 is generated from the raw material 3, so that the raw material gas moves upwardly. The raw material gas is generated from the raw material 3, and a part of the raw material gas is gathered by the gas flow control member 6 so that the raw material gas flows toward the seed crystal 5. As shown in FIG. 2, the part of the raw material gas generated from the raw material 3 flows toward the cover 2 through the clearance 9 between the inner wall of the gas flow control member 6 and the seed crystal 5. The other part of the raw material gas generated from the raw material 3 flows toward the cover 2 through the gas passage 10 between the inner wall of the crucible 1 and the gas flow control member 6.

Thus, the raw material gas is supplied to the seed crystal 5 in the growth chamber so that the SiC single crystal 11 grows from the seed crystal 5 downwardly. Specifically, the raw material gas flowing through the growth chamber is gathered by the gas flow control member 6 so that the raw material gas flows toward the seed crystal 5. The concentration of the raw material gas at the growth surface of the seed crystal 5 becomes higher. The raw material gas flows through the clearance 9, and the initial SiC single crystal 11a grows from the seed crystal 5. The initial SiC single crystal 11a grows in the early stage of the crystal growth. Thus, the initial single crystal 11a is a part of the single crystal 11, which grows in the early stage of the crystal growth. The initial SiC singe crystal 11a has a cylindrical shape having the uniform diameter. Further, the crystal growth proceeds, so that the second SiC single crystal 11b grows from the seed crystal 5. The second SiC single crystal grows in the second stage of the crystal growth. The second SiC single crystal 11b continuously grows from the seed crystal 5 through the initial SiC single crystal 11a. The second SiC single crystal 11b has a larger diameter, which becomes larger as the crystal growth proceeds. Thus, the initial single crystal 11a provide a cylindrical part of the single crystal 11. The second single crystal 11b provides a diameter-expanded part of the single crystal 11a.

A SiC poly crystal 12 is deposited on the bottom of the cover 2. This is, the SiC single crystal 11 grows from the seed crystal 5, and the poly crystal 12 is deposited around the base 4 so that the poly crystal 12 is completely separated from the single crystal 11. In the above crystal growth process, the poly crystal 12 may be easily adhered to the inner wall of the gas flow control member 6. Specifically, the poly crystal 12 may be easily deposited on the inner wall facing the single crystal 11 to be formed. The poly crystal 11 may prevent the single crystal 12 from increasing the diameter and the length of the single crystal 11. Since the bottom end of the gas flow control member 6 is near the raw material 3, the poly crystal 12 may be easily deposited near the bottom end of the gas flow control member 6. The raw material gas disposed near the bottom end of the gas flow control member 6 flows though the gas passage 10 to the cover 2. Thus, the gas passage 10 provides the raw material gas flow bypassing the inner wall of the gas flow control member 6. Specifically, the raw material gas flow bypasses the inner wall of the gas flow control member 6 facing the single crystal 11. Thus, the concentration of the raw material gas on the inner wall of the gas flow control member 6 facing the single crystal 11 is reduced. This is, the concentration of the raw material gas on the inner wall is diluted. Thus, the poly crystal 12 is prevented from adhering to the bottom end of the gas flow control member 6 and the inner wall of the gas flow control member 6. The single crystal 11 grows from the seed crystal 5 without contacting the poly crystal 12 so that the length and the diameter of the single crystal 11 become larger.

The shape of the gas flow control member 6 affects the outline of the single crystal 11. Specifically, the outline of the single crystal 11 becomes a certain shape along with the inner wall of the gas flow control member 6. By using this shape, the strain in the single crystal 11 can be controlled.

Mainly, the strain in the single crystal 11 is generated from the interface between the seed crystal 5 and the base 4. To reduce the strain from the interface, the diameter of the single crystal 11 at the beginning of the crystal growth is controlled to be constant. This is, the diameter is not enlarged at the early stage of the crystal growth. Specifically, when the initial single crystal 11a grows in the initial stage, the diameter of the single crystal 11a is not changed substantially, so that a rate of change of the diameter of the initial single crystal 11a per 1 mm in the growth direction is within ±5%. Here, the rate of change is defined as A1. To realize this, a rate of change of the inner diameter of the upper cylinder 7 of the gas flow control member 6 per 1 mm in the growth direction is designed within ±5%. Here, the rate of change of the upper cylinder 7 is defined as B1.

Figure 4:
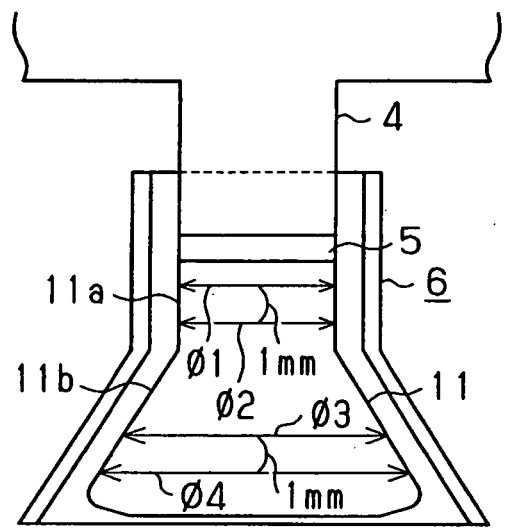
FIG. 4 is a schematic side view showing dimensions of the SiC single crystal, according to the first embodiment.

As shown in FIG. 4, the diameter of the initial single crystal 11a at a certain position is defined as $\phi 1$. Another diameter of the initial single crystal 11a at another certain position is defined as $\phi 2$. The distance between the certain position and the other certain position is 1 mm. The rate A1 (%) of change of the diameter is obtained by $[(\phi 2-\phi 1)/\phi 1] \times 100$.

Figure 5:
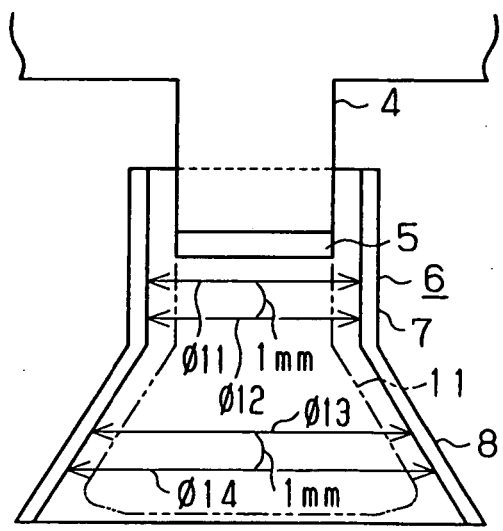
FIG. 5 is a schematic side view showing dimensions of a gas flow control member in the apparatus according to the first embodiment.

As shown in FIG. 5, the inner diameter of the upper cylinder 7 of the gas flow control member 6 corresponding to the initial single crystal 11a at a certain position is defined as $\phi 11$. Another inner diameter of the upper cylinder 7 at another certain position is defined as $\phi 12$. The distance between the certain position and the other certain position is 1 mm. The rate B1 (%) of change of the inner diameter is obtained by $[(\phi 12-\phi 11)/\phi 11] \times 100$.

The rate B1 (%) of change of the inner diameter of the upper cylinder 7 is designed within ±5% so that the rate A1 (%) of change of the diameter of the single crystal 11 is controlled to be within ±5%. In this case, the strain generated from the interface between the seed crystal 5 and the base 4 is reduced, so that the single crystal 11 having good quality is obtained. Specifically, the single crystal 11 having a long length and a large diameter grows from the seed crystal 5.

The upper cylinder 7 having the uniform inner diameter is disposed on the seed crystal side so that the strain in the initial single crystal 11a is reduced. To increase the diameter of the single crystal 11, the lower cylinder 8 having the tapered shape is connected to the upper cylinder 7 continuously. Thus, the diameter of the second single crystal 11b is increased after the strain in the initial single crystal 11a is reduced. The second single crystal 11b grows from the seed crystal 5 through the initial single crystal 11a continuously and integrally, so that the single crystal 11 having the initial single crystal 11a and the second single crystal 11b, which are formed integrally and successively, has good quality.

To realize the above second crystal growth, a rate of change of the diameter of the second single crystal 11b per 1 mm in the growth direction is within 50%. Here, the rate of change is defined as A2. To realize this, a rate of change of the inner diameter of the lower cylinder 8 of the gas flow control member 6 per 1 mm in the growth direction is designed within 50%. Here, the rate of change of the lower cylinder 8 is defined as B2.

As shown in FIG. 4, the diameter of the second single crystal 11b at a certain position is defined as $\phi 3$. Another diameter of the second single crystal 11b at another certain position is defined as $\phi 4$. The distance between the certain position and the other certain position is 1 mm. The rate A2 (%) of change of the diameter is obtained by $[(\phi 4-\phi 3)/\phi 3] \times 100$.

As shown in FIG. 5, the inner diameter of the lower cylinder 8 of the gas flow control member 6 corresponding to the second single crystal 11b at a certain position is defined as $\phi 13$. Another inner diameter of the lower cylinder 8 at another certain position is defined as $\phi 14$. The distance between the certain position and the other certain position is 1 mm. The rate B2 (%) of change of the inner diameter is obtained by $[(\phi 14-\phi 13)/\phi 13] \times 100$.

The rate B2 (%) of change of the inner diameter of the lower cylinder 8 is designed within 50% so that the rate A2 (%) of change of the diameter of the second single crystal 11b is controlled to be within 50%. In this case, the strain generated from the interface between the seed crystal 5 and the base 4 is reduced, so that the initial single crystal 11a having good quality is obtained. Successively, the second single crystal 11b grows on the initial single crystal 11a continuously, so that the strain in the second single crystal 11b is also reduced. Thus, the single crystal 11 having a long length and a large diameter grows from the seed crystal 5. The single crystal 11 having the initial single crystal 11a and the second single crystal 11b has high quality.

This method for manufacturing the SiC single crystal 11 has simple construction so that the manufacturing cost is reduced. Further, mass productivity is improved. Furthermore, the single crystal 11 having high quality, large diameter and long length provides the mass production of the SiC single crystal wafer, so that the industrial significant of the method is increased.

Figure 6:
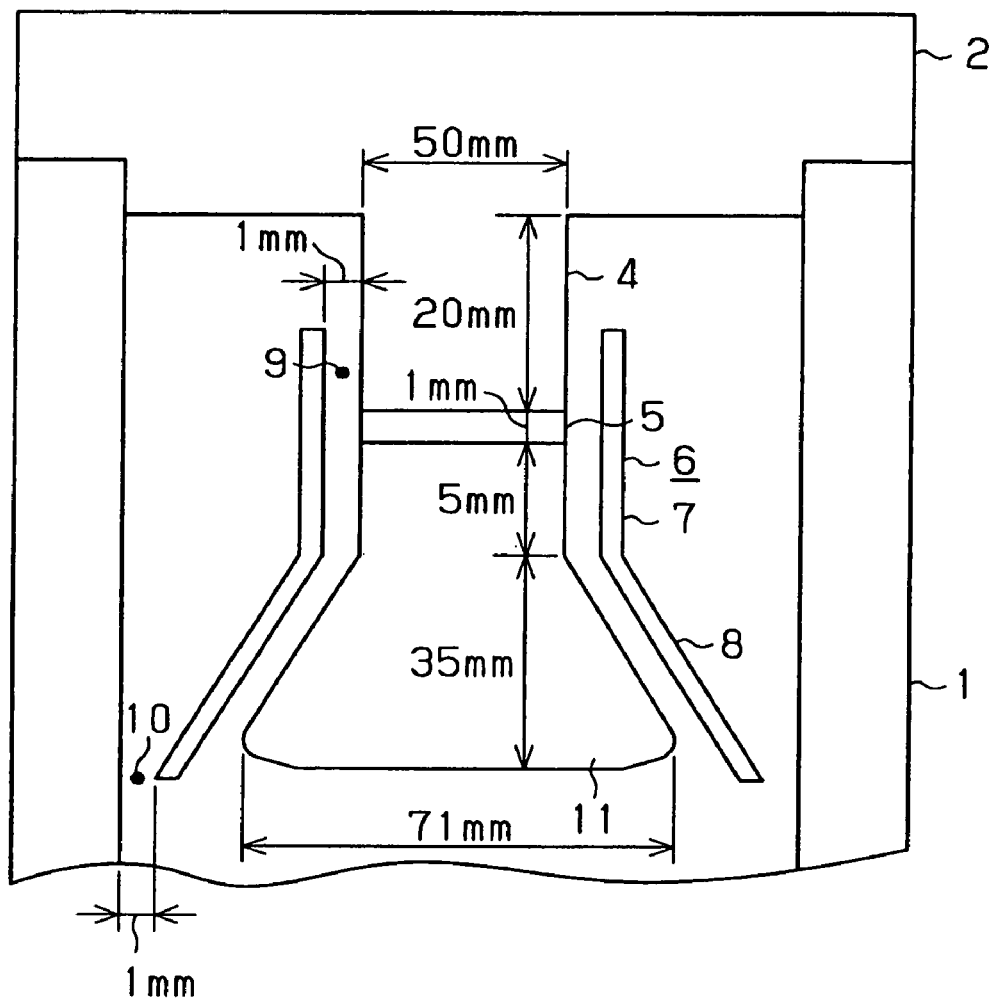
FIG. 6 is a schematic side view showing dimensions of the apparatus according to the first embodiment.

The above method is performed, for example, as follows. As shown in FIG. 6, the base 4 protruded from the cover 2 has a diameter of 50 mm and a height of 20 mm. The base 4 has a cylindrical shape. The seed crystal 5 has a diameter of 50 mm and a thickness of 1 mm. The seed crystal 5 is bonded on the bottom of the base 4. The gas flow control member 6 is disposed to surround the base 4. The width of the clearance between the base 4 and the gas flow control member 6 is 1 mm. The shape of the upper cylinder 7 is designed so that the increasing rate of the diameter of the initial single crystal 11a is in a range between −5%/mm and +5%/mm. The diameter of the initial single crystal 11a is not changed substantially. The shape of the lower cylinder 8 is designed so that the increasing rate of the diameter of the second single crystal 11b is equal to or smaller than 50%/mm. The diameter of the second single crystal 11b is increased with the increasing rate equal to or smaller than 50%/mm. For example, the lower cylinder 8 is designed to have an inner diameter, an increasing rate of which is within 50% per 1 mm in a growth direction. The gas passage 10 has a width of the clearance of 1 mm.

The seed crystal 5 is a plate shaped hexagonal SiC single crystal, which is formed by the sublimation method. The growth surface of the seed crystal 5 has a surface orientation of (0001). The crucible 1 is mounted in the high frequency furnace. The inner pressure in the furnace is decompressed to $2 \times 10^{-5}$ Torr. Then, the high purity argon (i.e., Ar) gas is introduced into the furnace so that the inner pressure in the furnace is increased up to 700 Torr. Then, the furnace is heated so that the temperature of the seed crystal 5 is increased up to 2200° C. After the temperature of the seed crystal 5 reaches to the predetermined temperature, the inner pressure in the furnace is decompressed down to 10 Torr. Then, the crystal growth is performed to begin. After this state is held during 100 hours, the inner pressure in the furnace is increased up to an atmospheric pressure, and the furnace is cooled. Then, the SiC single crystal 11 is removed from the crucible 5.

The single crystal 11 having the long length and large diameter is obtained. Specifically, the single crystal 11 includes the initial single crystal 11a having the diameter of 50 mm and the height (i.e., growth height) of 5 mm, and the second single crystal 11b having the maximum diameter of 71 mm and the growth height of 35 mm. Further, no poly crystal 12 is adhered on the inner wall of the gas flow control member 6, so that the single crystal 11 smoothly grows. Thus, the poly crystal 12 does not prevent the crystal growth of the single crystal 11. This is because the concentration of the raw material gas disposed near the inner wall of the gas flow control member 6 is diluted by the gas passage 10. Furthermore, the poly crystal 12 deposited around the base 4 is a small amount, so that the poly crystal 12 does not contact the gas flow control member 6. Therefore, the poly crystal 12 does not contact the single crystal 11 so that the single crystal 11 is completely separated from the poly crystal 12.

The single crystal 11 is sliced in a direction perpendicular to the growth direction so that multiple SiC wafers having the {0001} surface and thickness of 0.6 mm are obtained. The curvature of the wafer is examined by X-ray diffraction equipment. The wafer obtained near the seed crystal 5 has the curvature of 0.36°/cm. The wafer obtained from the part of the second single crystal 11b disposed at the bottom of the single crystal 11 having the maximum diameter has the curvature of 0.0027°/cm. Thus, the curvature is reduced as it goes from the seed crystal 5 to the bottom of the single crystal 11. Therefore, the strain in the single crystal 11 is also reduced. This effect is confirmed by a thermal stress analysis with using a computer. Further, in view of the above result and the computer analysis, the method for growing the single crystal 11 with two steps effectively reduces the strain in the single crystal 11, the two steps are such that the diameter of the single crystal 11 is changed in two steps.

The method of the present embodiment provides the single crystal 11 having high quality, which is separated from the poly crystal 12. Further, the single crystal 11 having the large diameter and the long length is obtained effectively.

The above method has the following characteristics. As shown in FIG. 3, the raw material gas flowing through the growth chamber is controlled by the gas flow control member 6 so that the raw material gas flows toward the seed crystal 5. At this time, the raw material gas passes through the clearance 9 between the inner wall of the gas flow control member 6 and the seed crystal 5. A part of the raw material gas flows through the gas passage 10 disposed between the inner wall of the crucible 1 and the gas flow control member 6 so that the part of the raw material gas bypasses the gas flow control member 6, i.e., the seed crystal 5. The single crystal 11 grows to have the uniform diameter at the beginning of the crystal growth, and then, the single crystal 11 grows to enlarge the diameter at the secondary stage of the crystal growth.

Thus, the raw material gas is concentrated with the gas flow control member 6 so that the raw material gas flows toward the seed crystal 5. The concentration of the raw material gas at the growth surface of the seed crystal 5 becomes higher so that the single crystal 11 grows smoothly.

Here, in general, the strain generated at a support portion of the seed crystal 5, which is the interface between the seed crystal 5 and the base 4, may be introduced into the single crystal 11. However, in this method, the single crystal 11 grows to have the uniform diameter at the beginning of the crystal growth so that the strain in the initial single crystal 11a is reduced. Thus, the single crystal 11 has the high quality, the large diameter and the long length.

Further, in general, the ploy crystal 12 may be deposited on the inner wall of the gas flow control member 6, the inner wall which faces the single crystal 11, so that the poly crystal 12 prevents the single crystal 11 from growing larger and longer. In the present method, a part of the raw material gas flows through the gas passage 10 so that the part of the raw material gas bypasses the gas flow control member 6, i.e., the seed crystal 5. Therefore, the concentration of the raw material gas at the inner wall of the gas flow control member 6, which faces the single crystal 11, is reduced. The raw material gas is diluted so that the poly crystal 12 is prevented from adhering to the inner wall of the gas flow control member 6. Thus, the single crystal 11 grows without contacting the poly crystal 12 so that the single crystal 11 can have the long length.

(Other Embodiments)

The above method can be modified as follows.

One modified method is provided by the gas flow control member 6, the clearance 9 and the gas passage 10. Although the gas flow control member 6 has a funnel shape composed of the upper and lower cylinders 7, 8, the gas flow control member 6 can have another shape.

Another modified method is provided by the gas flow control member 6 and the clearance 9.

Specifically, the above modified methods are described as follows in detail.

Figure 7:
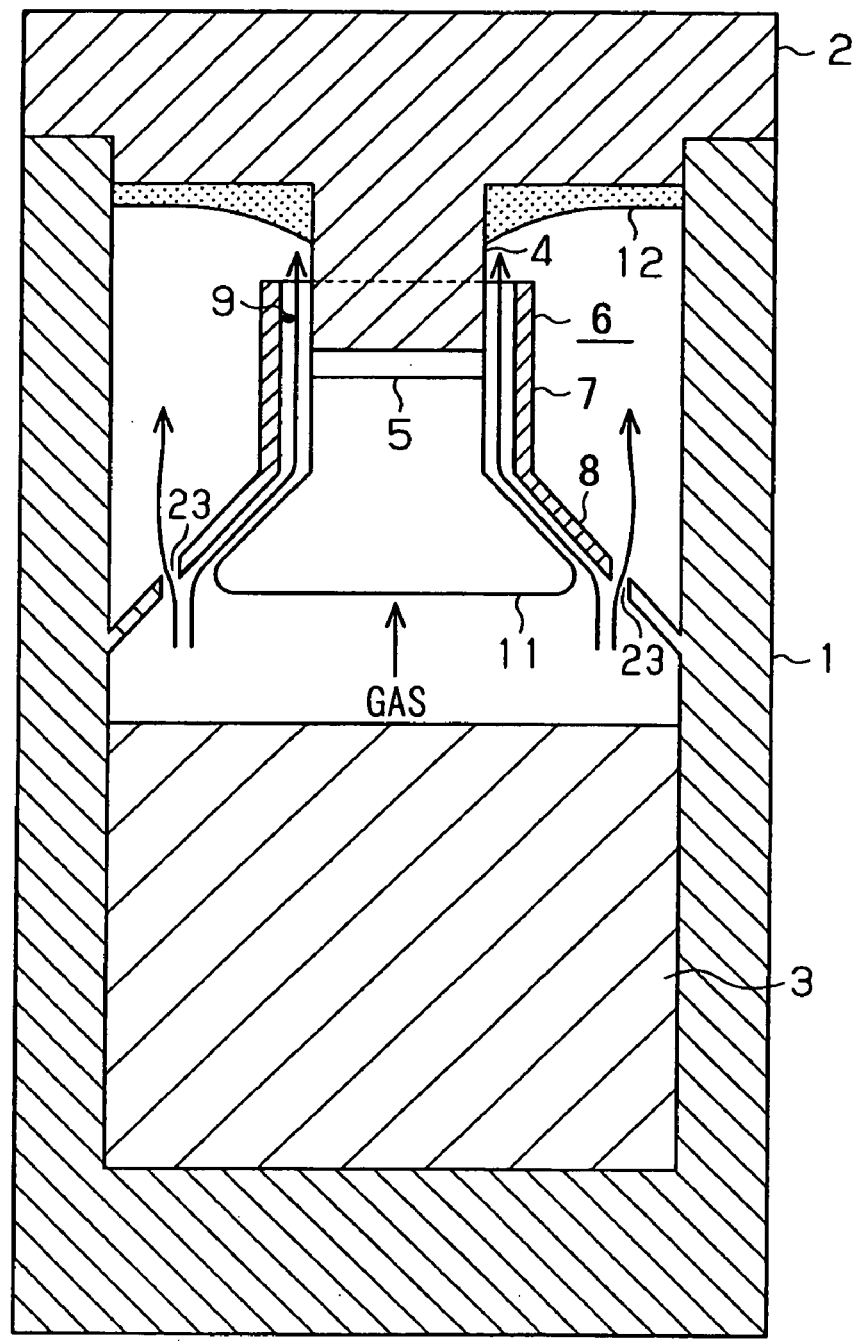
FIG. 7 is a cross sectional view showing an apparatus for manufacturing SiC single crystal according to the other embodiments of the present invention.
Figure 8:
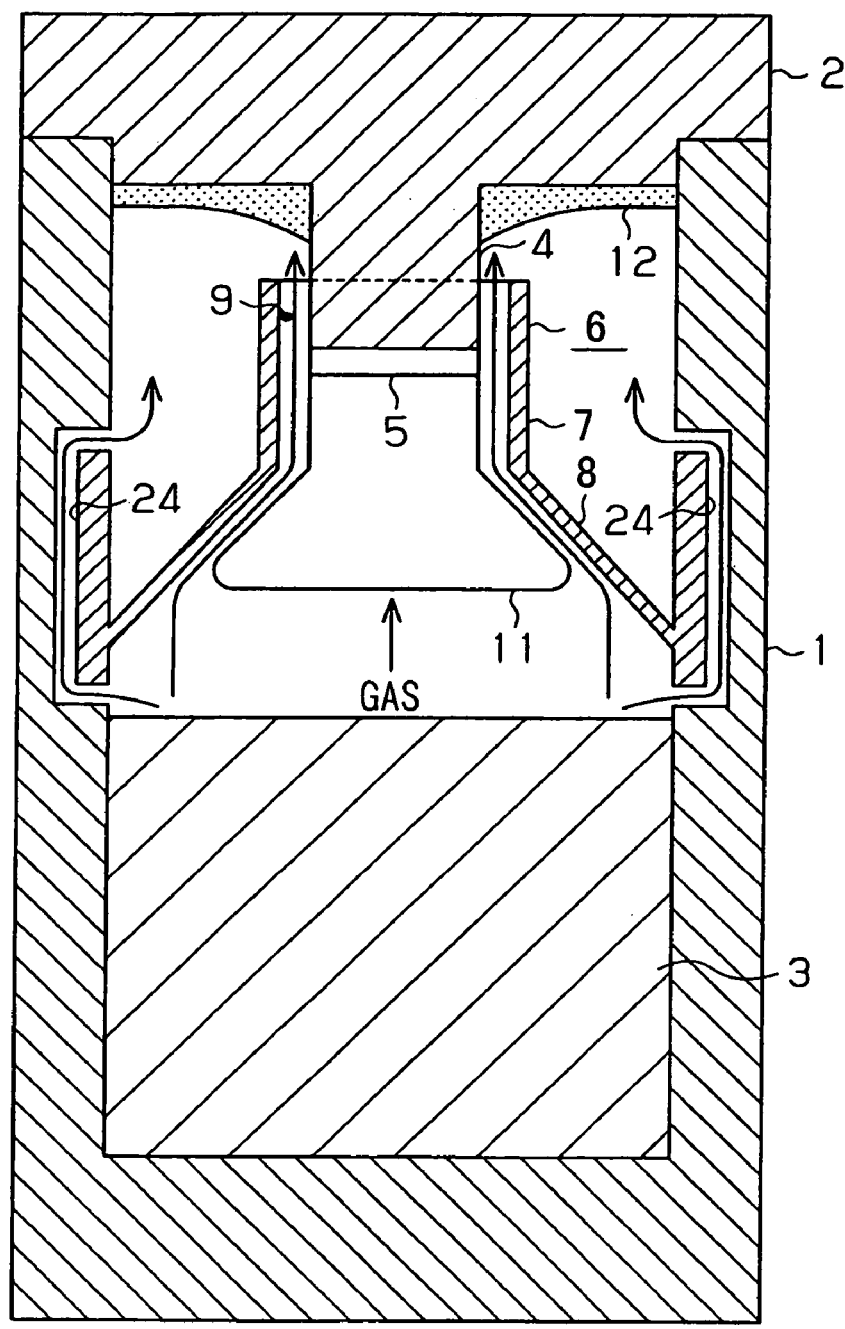
FIG. 8 is a cross sectional view showing an apparatus according to the other embodiments.

Although the apparatus includes the gas passage 10 disposed between the inner wall of the crucible 1 and the outer circumference of the gas flow control member 6, another gas passage 10 can be used. For example, as shown in FIGS. 7 and 8, the gas passage 10 is provided by a through hole 23 formed in the gas flow control member 6, or the gas passage 10 is provided by another gas passage 24. In FIG. 7, the through hole 23 is disposed on the lower cylinder 8 of the gas flow control member 6. Specifically, the through hole 23 is disposed outside of the lower cylinder 8. The part of the raw material gas flows through the through hole 23 so that the part of the raw material gas bypasses the seed crystal 5. The through hole 23 provides the raw material gas flow bypassing the seed crystal 5. In FIG. 8, the gas passage 24 provides the raw material gas flow bypassing the seed crystal 5.

Figure 9:
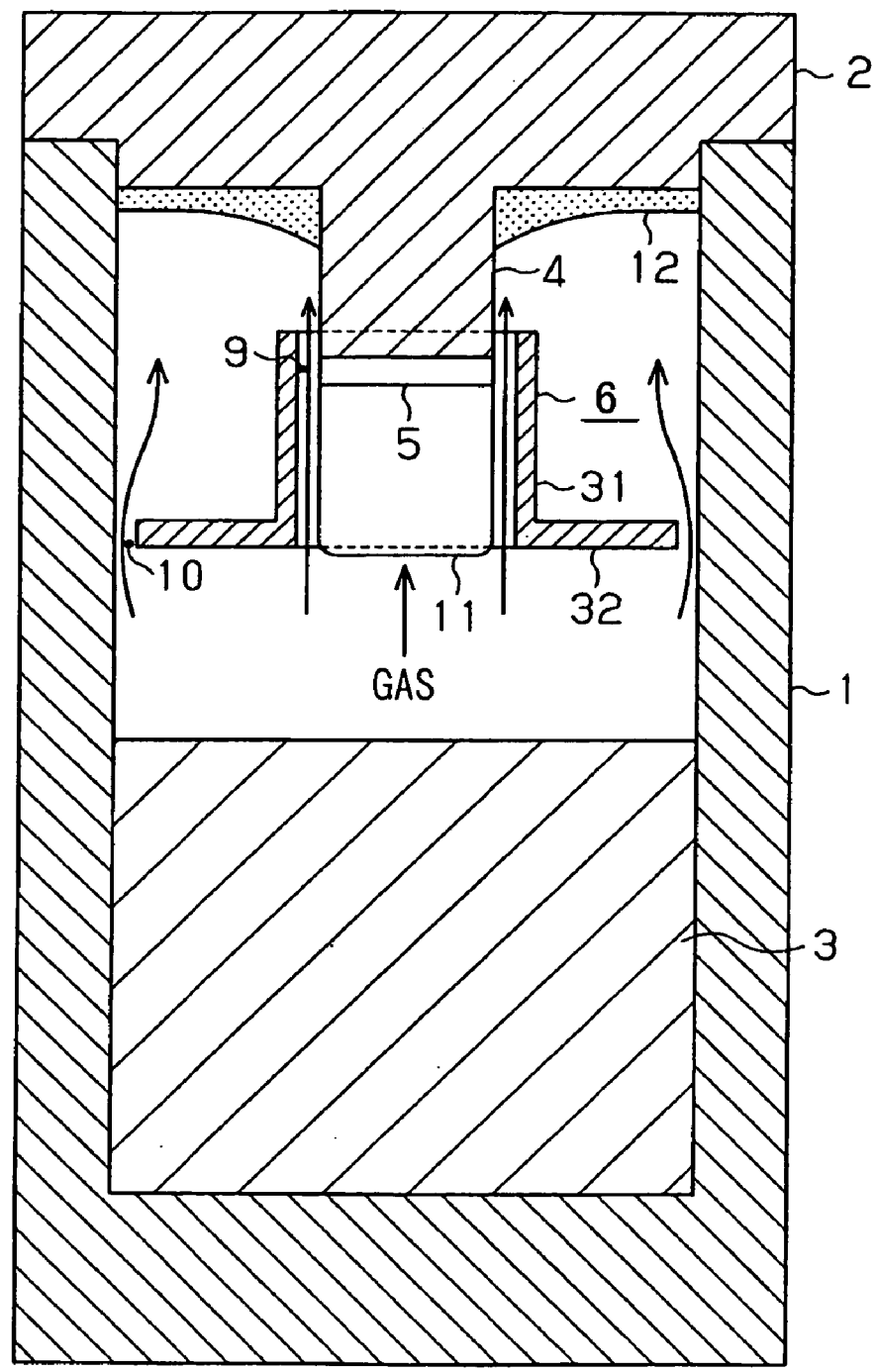
FIG. 9 is a cross sectional view showing an apparatus according to the other embodiments.
Figure 10:
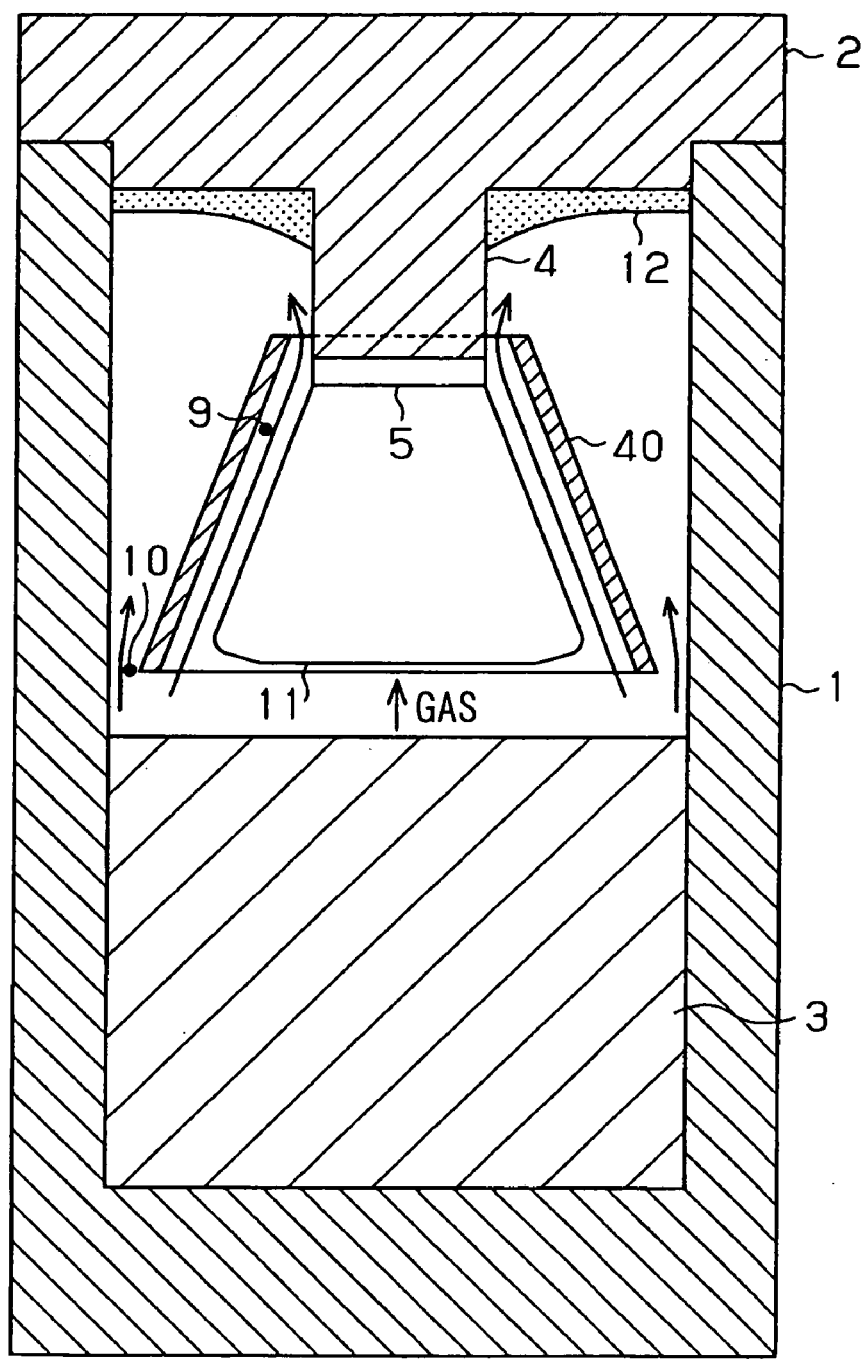
FIG. 10 is a cross sectional view showing an apparatus according to the other embodiments.
Figure 11:
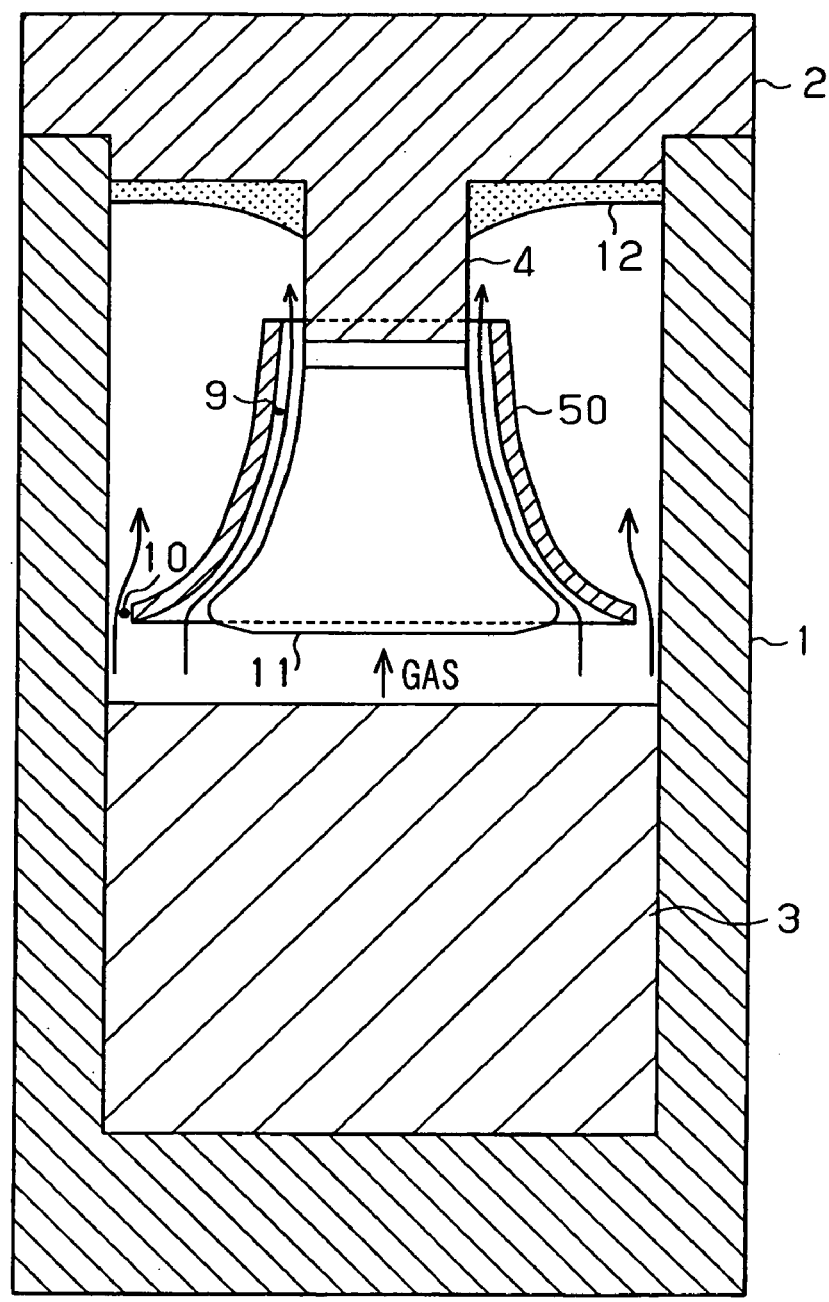
FIG. 11 is a cross sectional view showing an apparatus according to the other embodiments.

Although the gas flow control member 6 is composed of the upper and lower cylinders 7, 8, the gas flow control member 6 can have another shape. For example, in FIG. 9, the gas flow control member 6 includes an upper part 31 and a lower part 32. The upper part 31 has a cylindrical shape with a predetermined uniform diameter. The lower cylinder 32 has a disk shape. The upper and lower parts 31, 32 are connected together. The gas passage 10 is disposed between the outer circumference of the lower part 32 and the inner wall of the crucible 1. In FIG. 10, the gas flow control member 40 has a tapered cylindrical shape (i.e., a circular cone shape). The gas passage 10 is disposed between the bottom circumference of the gas flow member 40 and the inner wall of the crucible 1. In FIG. 11, the gas flow control member 50 has a tapered cylindrical shape (i.e., a horn shape). The gas passage 10 is disposed between the bottom circumference of the gas flow member 50 and the inner wall of the crucible 1. The gas flow control member 50 has an inner wall formed by a curved surface. The top of the gas flow control member 50 corresponding to the initial single crystal 11a is narrowed. Therefore, the strain in the single crystal 11 is reduced. After the strain is reduced at the beginning of the crystal growth, the diameter of the single crystal 11 is increased.

Figure 12:
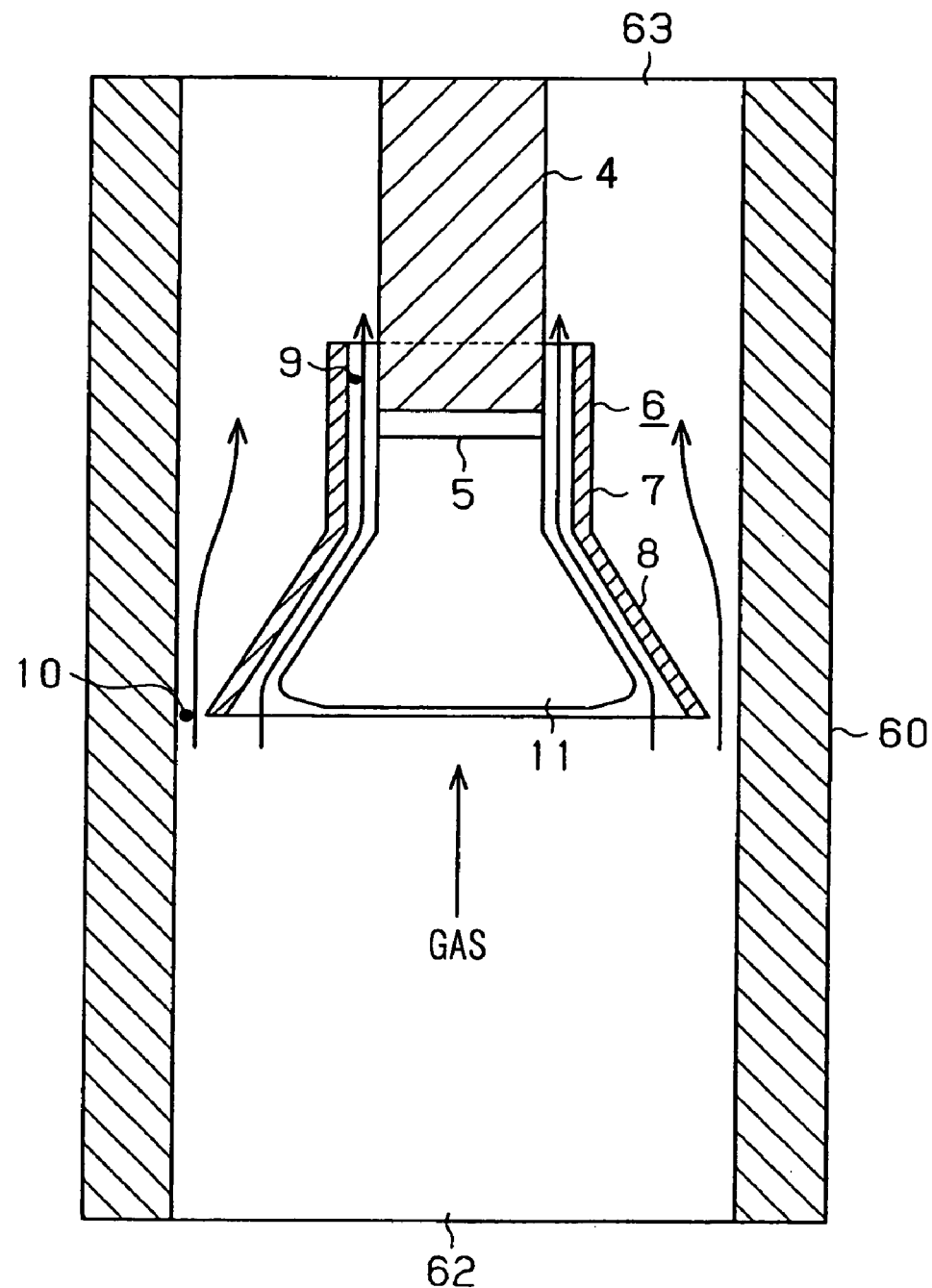
FIG. 12 is a cross sectional view showing an apparatus according to the other embodiments.

Although the method is applied to the modified Lely method, the method can be applied to another crystal growth method such as a chemical vapor deposition method. In case of the chemical vapor deposition, a reactive chamber (i.e., a growth chamber) 60 has top and bottom surfaces opened so that the reactive chamber 60 does not provide almost closed space, as shown in FIG. 12. Thus, the reactive chamber 60 includes an upper opening 63 and a lower opening 62 so that the raw material gas passes through the reactive chamber 60. The raw material gas is introduced into the reactive chamber 60 through the lower opening 62, and then, the gas is discharged from the upper opening 63. In this method, a mixed gas composed of mono silane gas including silicon and propane gas including carbon is introduced into the chamber 60 so that the SiC single crystal 11 grows, although the single crystal 11 is formed from a solid raw material such as powder by using the sublimation method. Here, the seed crystal 5 is bonded on the bottom of the base 4, which is disposed on the upper opening side.

Thus, the method can be applied to other methods instead of the sublimation method. Further, the method can be used for manufacturing other crystal instead of the SiC single crystal 11. For example, the method can be used for an inorganic compound such as a compound semiconductor, a single element semiconductor, and an oxide compound. The compound semiconductor is, for example, zinc selenide (i.e., ZnSe, which is II–VI series compound), gallium arsenide (i.e., GaAs, which is III–V series compound), aluminum nitride (i.e., AlN, which is III–V series nitride compound), or gallium nitride (i.e., GaN, which is III–V series nitride compound). The single element semiconductor is, for example, silicon (i.e., Si), or diamond (i.e., C). The oxide compound is, for example, aluminum oxide (i.e., $Al_2O_3$) or titanium oxide (i.e., $TiO_2$).

Such changes and modifications are to be understood as being within the scope of the present invention as defined by the appended claims.

What is claimed is:

1. A method for manufacturing a single crystal, the method comprising the steps of:
    flowing a raw material gas toward a seed crystal in a reactive chamber so that the single crystal grows from the seed crystal;
    controlling the raw material gas by a gas flow control member having a cylindrical shape;
    passing the raw material gas through a clearance between the seed crystal and an inner wall of the gas flow control member; and
    flowing a part of the raw material gas to bypass the seed crystal through a gas passage, the gas passage being disposed between an inner wall of the reactive chamber and an outer surface of the gas flow control member.

2. The method according to claim 1, wherein
    the seed crystal is mounted on a base, and
    the clearance between the seed crystal and the inner wall of the gas flow control member is also disposed between the base and the inner wall of the gas flow control member.

3. A method for manufacturing a single crystal, the method comprising the steps of:
    flowing a raw material gas toward a seed crystal in a reactive chamber so that the single crystal grows from the seed crystal;
    controlling the raw material gas by a gas flow control member having a cylindrical shape;
    passing the raw material gas through a clearance between the seed crystal and an inner wall of the gas flow control member; and
    flowing a part of the raw material gas to bypass the seed crystal,
    wherein the gas flow control member includes a first part having an uniform diameter, a rate of change of which is within ±5% per 1 mm in a growth direction.

4. The method according to claim 3,
    wherein the gas flow control member further includes a second part having a tapered shape and having an diameter, an increasing rate of which is within 50% per 1 mm in the growth direction.

5. A method for manufacturing a single crystal, the method comprising the steps of:
    flowing a raw material gas toward a seed crystal in a reactive chamber so that the single crystal grows from the seed crystal;
    controlling the raw material gas by a gas flow control member having a cylindrical shape;
    passing the raw material gas through a clearance between the seed crystal and an inner wall of the gas flow control member; and
    growing the single crystal to have a cylindrical shape, which includes an initial crystal growth part having an uniform diameter in a growth direction,
    wherein the initial crystal growth part of the single crystal grows from the seed crystal at a beginning step of a crystal growth.

6. The method according to claim 5,
    wherein, in the step of growing the single crystal, the single crystal grows to have a rate of change of a diameter of the initial crystal growth part of the single crystal within ±5% per 1 mm in the growth direction.

7. The method according to claim 5,
    wherein, in the step of growing the single crystal, the single crystal grows to have a increasing rate of a diameter of a secondary crystal growth part within 50% per 1 mm in the growth direction, and
    wherein the secondary crystal growth part of the seed crystal grows from the seed crystal next to the initial crystal growth part at a secondary step of the crystal growth.

8. The method according to claim 5, further comprising the step of:
    flowing a part of the raw material gas to bypass the seed crystal.

9. The method according to claim 5,
    wherein the gas flow control member includes a first part and a second part, and
    wherein the first part of the gas flow control member has an uniform diameter so that the initial crystal growth part of the single crystal grows to have the uniform diameter, a rate of change of which is within ±5% per 1 mm in the growth direction.

10. The method according to claim 9,
    wherein the second part of the gas flow control member has a tapered shape so that the secondary crystal growth part of the single crystal grows to have an increasing diameter, an increasing rate of which is within 50% per 1 mm in the growth direction.

11. The method according to claim 5,
    wherein the single crystal is one of SiC, ZnSe, GaAs, AlN, GaN, Si, C, $Al_2O_3$ or $TiO_2$.

12. A method for manufacturing a single crystal, the method comprising the steps of:

flowing a raw material gas toward a seed crystal in a reactive chamber so that the single crystal grows from the seed crystal;

controlling the raw material gas by a gas flow control member having a cylindrical shape;

passing the raw material gas through a clearance between the seed crystal and an inner wall of the gas flow control member; and flowing a part of the raw material gas to bypass the seed crystal through a through hole, which is disposed in the gas flow control member.

13. The method according to claim 12,
wherein the gas flow control member further includes a first part having a uniform diameter, a rate of change of which is within ±5% per 1 mm in a growth direction.

14. The method according to claim 13,
wherein the gas flow control member further includes a second part having a tapered shape and having a diameter, the diameter having an increasing rate of within 50% per 1 mm in the growth direction.

15. A method for manufacturing a single crystal, the method comprising the steps of:

flowing a raw material gas toward a seed crystal in a reactive chamber so that the single crystal grows from the seed crystal;

controlling the raw material gas by a gas flow control member having a cylindrical shape;

passing the raw material gas through a clearance between the seed crystal and an inner wall of the gas flow control member; and flowing a part of the raw material gas to bypass the seed crystal through a gas passage, wherein the gas flow control member further includes a gas passage part, which faces an inner wall of the reactive chamber in parallel, and the gas passage is disposed between the gas passage part of the gas flow control member and the inner wall of the reactive chamber.

16. The method according to claim 15,
wherein the gas flow control member further includes a first part having a uniform diameter, a rate of change of which is within ±5% per 1 mm in a growth direction.

17. The method according to claim 16,
wherein the gas flow control member further includes a second part having a tapered shape and having a diameter, an increasing rate of which is within 50% per 1 mm in the growth direction.

* * * * *